United States Patent
Li et al.

(10) Patent No.: US 11,136,030 B2
(45) Date of Patent: Oct. 5, 2021

(54) METHOD AND DEVICE FOR CONTROLLING VEHICLE, AND STORAGE MEDIUM

(71) Applicant: Tsinghua University, Beijing (CN)

(72) Inventors: Shengbo Li, Beijing (CN); Bo Cheng, Beijing (CN); Keqiang Li, Beijing (CN); Hongbo Gao, Beijing (CN); Xiaoxue Zhang, Beijing (CN); Renjie Li, Beijing (CN); Zhitao Wang, Beijing (CN); Hailiang Chen, Beijing (CN); Jianqiang Wang, Beijing (CN); Yugong Luo, Beijing (CN); Diange Yang, Beijing (CN)

(73) Assignee: TSINGHUA UNIVERSITY, Beijing (CN)

(*) Notice: Subject to any disclaimer, the term of this patent is extended or adjusted under 35 U.S.C. 154(b) by 77 days.

(21) Appl. No.: 16/746,908

(22) Filed: Jan. 19, 2020

(65) Prior Publication Data
US 2020/0180624 A1   Jun. 11, 2020

Related U.S. Application Data

(63) Continuation of application No. PCT/CN2017/114696, filed on Dec. 6, 2017.

(30) Foreign Application Priority Data

Aug. 22, 2017   (CN) .................. 201710722814.X

(51) Int. Cl.
*B60W 30/16*   (2020.01)
*B60W 10/04*   (2006.01)
(Continued)

(52) U.S. Cl.
CPC .......... *B60W 30/162* (2013.01); *B60W 10/04* (2013.01); *B60W 40/04* (2013.01);
(Continued)

(58) Field of Classification Search
CPC .... B60W 30/162; B60W 10/04; B60W 40/04; B60W 50/00; B60W 4/46;
(Continued)

(56) References Cited

U.S. PATENT DOCUMENTS

2006/0195250 A1* 8/2006 Kawaguchi ............ G08G 1/161
                                                        701/117
2013/0116861 A1* 5/2013 Nemoto ................ B60W 30/16
                                                        701/2
(Continued)

OTHER PUBLICATIONS

WIPO, ISR for PCT/CN2017/114696, dated May 22, 2018.
(Continued)

*Primary Examiner* — Hussein Elchanti
(74) *Attorney, Agent, or Firm* — Hodgson Russ LLP

(57) ABSTRACT

The present disclosure provides a method and a device for controlling a vehicle. The vehicle is in a vehicle queue, the vehicle queue includes n vehicles {vehicle 0, vehicle 1, . . . , vehicle n-1} arranged in order along a traveling direction, the method is performed by a computing device of the vehicle i, i is from 1 to n-1. A vehicle-following subsystem model is established based on the relative speed and the relative vehicle distance error between the vehicle i and a vehicle i-1, and the acceleration of the vehicle i, a state trajectory of the vehicle-following subsystem model on a $\Delta v$-$\Delta R$ plane is determined, a plurality of division graphs of the vehicle i-1 in a plurality of travelling phases are combined to obtain a switching control graph for the vehicle i, and the travelling phase of the vehicle i is adjusted.

20 Claims, 6 Drawing Sheets

(51) Int. Cl.
  *B60W 40/04* (2006.01)
  *B60W 50/00* (2006.01)
  *G08G 1/052* (2006.01)
  *G08G 1/00* (2006.01)
  *H04W 4/46* (2018.01)

(52) U.S. Cl.
  CPC ............. *B60W 50/00* (2013.01); *G08G 1/052* (2013.01); *G08G 1/22* (2013.01); *B60W 2050/0028* (2013.01); *B60W 2400/00* (2013.01); *B60W 2554/408* (2020.02); *B60W 2554/4042* (2020.02); *B60W 2720/106* (2013.01); *H04W 4/46* (2018.02)

(58) Field of Classification Search
  CPC ... B60W 2554/408; B60W 2554/4042; B60W 2050/0028; B60W 2400/00; B60W 2720/106; G08G 1/052; G08G 1/22; H04W 4/46
  See application file for complete search history.

(56) References Cited

U.S. PATENT DOCUMENTS

| | | | | |
|---|---|---|---|---|
| 2014/0292545 | A1* | 10/2014 | Nemoto | G08G 1/017 340/988 |
| 2016/0200319 | A1* | 7/2016 | Nemoto | B60W 10/04 701/96 |
| 2017/0248959 | A1* | 8/2017 | Matsubara | B60W 10/20 |
| 2018/0105186 | A1* | 4/2018 | Motomura | B60W 50/14 |
| 2019/0071099 | A1* | 3/2019 | Nishiguchi | B62D 15/0255 |

OTHER PUBLICATIONS

Li et al., "Fuel-Saving Servo-Loop Control for an Adaptive Cruise Control System of Road Vehicles With Step-Gear Transmission," IEEE Transactions on Vehicular Technology, 2017, vol. 66, period 3, abstract only.

SIPO, First Office Action for CN Application No. 201710722814.X, dated Feb. 27, 2019.

* cited by examiner

METHOD AND DEVICE FOR CONTROLLING VEHICLE, AND STORAGE MEDIUM

CROSS-REFERENCE TO RELATED APPLICATION

This application is a continuation of International Application No. PCT/CN 2017/114696, filed Dec. 6, 2017, which claims priority to Chinese Patent Application No. 201710722814. X, filed Aug. 22, 2017, the entire disclosures of which are incorporated herein by reference.

FIELD

The present disclosure relates to the field of vehicle driving assistance technologies, and more particularly, to a method and a device for controlling a vehicle, and a storage medium.

BACKGROUND

In the related art, the fuel economy of the vehicle queue is poor under the premise of ensuring stability, and needs to be improved.

SUMMARY

Embodiments of the present disclosure provide a method for controlling a vehicle. The vehicle is in a vehicle queue, the vehicle queue includes n vehicles {vehicle 0, vehicle 1, . . . , vehicle n−1} arranged in order along a traveling direction, the method is performed by a computing device of the vehicle i, i is from 1 to n−1. The method comprises: obtaining acceleration of the vehicle i in each of a plurality of travelling phases; obtaining a relative speed $\Delta v_i$ between the vehicle i and a vehicle i−1, wherein the vehicle i−1 is a vehicle arranged in front of the vehicle i according to the traveling direction of the vehicle queue; obtaining a vehicle distance $R_i$ between the vehicle i and the vehicle i−1, and obtaining a relative vehicle distance error $\Delta R_i$ between the vehicle i and the vehicle i−1 based on the vehicle distance $R_i$ and a preset desired vehicle distance $R_{ides}$; establishing a vehicle-following subsystem model based on the relative speed $\Delta v_i$, the relative vehicle distance error $\Delta R_i$, and the acceleration of the vehicle i, and determining a state trajectory of the vehicle-following subsystem model on a $\Delta v$-$\Delta R$ plane, wherein the $\Delta v$-$\Delta R$ plane denotes a rectangular coordinate plane with the relative speed $\Delta v_i$ as a horizontal axis and the relative vehicle distance error $\Delta R_i$ as a vertical axis; determining, according to the state trajectory, a plurality of division graphs of the vehicle i−1 in a plurality of travelling phases, and combining the plurality of division graphs to obtain a switching control graph for the vehicle i; and obtaining an acceleration control value of the vehicle i according to the switching control map.

Embodiments of the present disclosure further provide a device for controlling a vehicle. The device includes a processor, and a memory. The processor is configured to run a program corresponding to executable program codes by reading the executable program codes stored in the memory, to perform the method for controlling a vehicle according to embodiments of the present disclosure.

Embodiments of the present disclosure further provide a non-transitory computer readable storage medium having stored thereon a computer program that, when executed by a processor, causes the method for controlling a vehicle according to embodiments of the present disclosure to be implemented.

Additional aspects and advantages of the present disclosure are set forth in the following descriptions, some of which will become obvious in the following descriptions, or be learned through practice of the present disclosure.

BRIEF DESCRIPTION OF THE DRAWINGS

These and other aspects and advantages of embodiments of the present disclosure will become apparent and more readily appreciated from the following descriptions made with reference to the drawings, in which.

DETAILED DESCRIPTION

Figure 1:
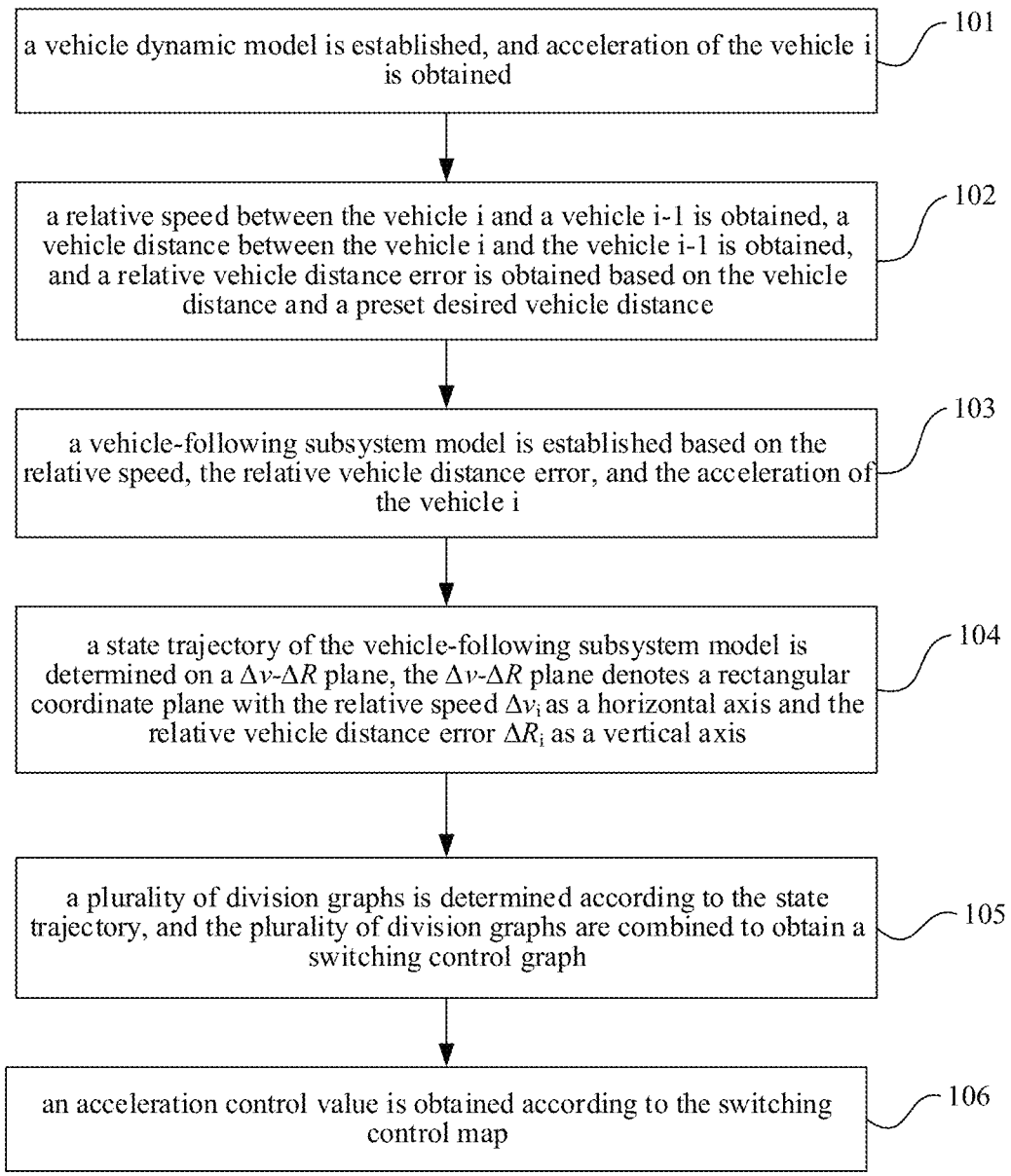
FIG. 1 is a flow chart of a method for controlling a vehicle according to some embodiments of the present disclosure.

The following describes in detail embodiments of the present disclosure. Examples of the embodiments are shown in the accompanying drawings, where numerals that are the same or similar from beginning to end represent same or similar modules or modules that have same or similar functions. The following embodiments described with reference to the accompanying drawings are exemplary, and are intended only to describe the present disclosure and cannot be construed as a limitation to the present disclosure. On the contrary, the embodiments of the present disclosure include all changes, modifications, and equivalents that do not depart from the spirit and connotation scope of the appended claims.

Pulse and Glide (PnG) strategy is a dynamic strategy, when a driver expects to drive at an average speed, the vehicle needs to accelerate from a low speed to a high speed first (a pulse phase), and then glides to a low speed (a glide phase). A pulse phase and a glide phase form a PnG cycle, and the average speed is equal to the expected travelling speed. In the PnG strategy, the engine of the vehicle periodically switches between the minimum brake specific fuel consumption (BSFC) point (corresponding to the pulse phase) and the idle point (corresponding to the glide phase), and the average fuel consumption rate of the vehicle will be lower than the constant cruise speed.

A method and a device for controlling a vehicle according to embodiments of the present disclosure will be described below with reference to accompanying drawings.

The vehicle is in a vehicle queue, which comprises n vehicles {vehicle 0, vehicle 1, . . . , vehicle n−1} arranged in order along a traveling direction, and every two adjacent vehicles in the vehicle queue may form a vehicle-following subsystem. The method may be applicable for a vehicle powered by an internal combustion engine. In an embodiment, a vehicle dynamic model may be established with the vehicle speed and acceleration as state variables, a vehicle-following subsystem model may be established with a relative speed and a relative vehicle distance error of two adjacent vehicles in the vehicle-following subsystem as state variables, and a plurality of travelling modes of the vehicle-following subsystem may be determined, and the state trajectory on a $\Delta v$-$\Delta R$ plane may be obtained. For the cases that the front vehicle pulses or glides, a corresponding division graph may be obtained, and the acceleration of the self-vehicle in each zone may be determined. Then, the division graph obtained when the front vehicle pulses or glides may be combined to obtain a switching control graph for the self-vehicle, and the acceleration of the self-vehicle may be adjusted.

At block 101, a vehicle dynamic model is established, and acceleration of the vehicle i is obtained.

A state equation of the vehicle dynamic model with the vehicle speed acceleration as state variables may be established, which may be expressed by:

$$\dot{s} = v$$
$$\dot{v} = \left(\frac{\eta_T P_e}{v} - C_A v^2 - Mfg\right) \cdot \frac{1}{\delta M}$$

where s denotes a travelling distance of the vehicle, v denotes the vehicle speed, $\eta_T$, denotes a total drive efficiency of a drive train, $C_A = 0.5 C_D \rho_a A_v$, $C_D$ denotes a drag coefficient, $\rho_a$ denotes an air density, $A_v$ denotes a windward area of the vehicle, M denotes a mass of the vehicle, g denotes a gravity coefficient, f denotes a friction coefficient, $\delta$ denotes a correction coefficient of rotating mass, $\dot{s}$ denotes derivative of s to time, i.e., speed; $\dot{v}$ denotes derivative of speed to time, i.e., acceleration.

Each vehicle in the vehicle queue adopts periodic switching control i.e., PnG control, the engine of the vehicle periodically switches between the minimum BSFC point and the idle point, and the vehicle alternately travels between the pulse phase and the glide phase.

In an embodiment, the vehicle is provided with a continuously variable transmission (CVT), and an optimal transmission speed ratio $i_g$ of the vehicle may be expressed by:

$$i_g = \frac{\pi r_w}{cvi_0} \cdot w_{eco}$$

where $i_0$ denotes a main reducer speed ratio, $r_w$ denotes a radius of vehicle tyres, c denotes a coefficient, and c is in range of 10~100. When the CVT is controlled by an economy curve of BSFC, the economy curve of the engine may satisfy:

$$T_{eco}(w_{eco}) = k_{eco}(w_{eco} - b)^\gamma$$

where $T_{eco}(w_{eco})$ denotes a torque of the engine on the economic curve of the BSFC, $T_{eco}(w_{eco})$ is generally in range of 0~200 Nm, $w_{eco}$ denotes a rotation speed of the engine on the economic curve of the BSFC, $w_{eco}$ is generally in range of 0~6000 rpm, and $k_{eco}$, $\gamma$ and b are fitting coefficients, $k_{eco}$ is generally in range of 0~20, $\gamma$ is generally in range of 0~1, b is generally in range of 900~1100.

When the gradient of $T_{eco}$ is zero (the derivative of $T_{eco}$ is 0), i.e., $\dot{T}_{eco-P}(w_{eco-P})=0$, the engine operates at the minimum fuel consumption point. In this case, the power of the engine may be expressed by:

$$P_{e-P} = \frac{2\pi}{60} w_{eco-P} \cdot T_{eco-P}$$

where $T_{eco-P}$, $w_{eco-P}$ and $P_{e-p}$ represent the torque, the rotation speed and the power of the engine at the minimum fuel consumption point, respectively. When the engine is at the minimum fuel consumption point, the vehicle is in the pulse phase, and the acceleration may be obtained by:

$$a_{pls} = \left(\frac{\eta_T P_{e-P}}{v} - C_A v^2 - Mfg\right) \cdot \frac{1}{\delta M} \quad (1)$$

When the vehicle is at the idle point, the accelerator pedal is completely released. In this case, the vehicle is in the glide phase, and $P_{e-P}=0$, the acceleration of the vehicle in the glide phase may be obtained by:

$$a_{gld} = (-C_A v^2 - Mfg) \cdot \frac{1}{\delta M} \quad (2)$$

At block 102, a relative speed between the vehicle i and a vehicle i−1 is obtained, a vehicle distance between the vehicle i and the vehicle i−1 is obtained, and a relative vehicle distance error is obtained based on the vehicle distance and a preset desired vehicle distance.

The vehicle i−1 is a vehicle arranged in front of the vehicle i according to the traveling direction of the vehicle queue. The speed of the vehicle i may be obtained, and the vehicle may communicate with the vehicle i through a communication device of the vehicle i, to obtain the speed of the vehicle i−1, and the relative speed $\Delta v_i$ between the vehicle i and the vehicle i−1 may be calculated based on the speed of the vehicle i and the speed of the vehicle i−1.

In an embodiment, the preset desired vehicle distance $R_{ides}$ and the relative vehicle distance error $\Delta R$ may be obtained by:

$$R_{ides} = \tau_h v_i + d_0$$

$$\Delta R = R_i - R_{ides}$$

$$-\Delta R_{bnd} < \Delta R < \Delta R_{bnd} \quad (3)$$

where $\Delta R$ denotes the relative vehicle distance error between two adjacent vehicles in the vehicle queue, $\tau_h$ denotes a preset time interval, do denotes a preset desired vehicle distance (i.e., the desired vehicle distance when the vehicle queue stops travelling), $\Delta R_{bnd}$ denotes the error bound, and $\Delta R_{bnd}$ is preset according to actual needs.

At block 103, a vehicle-following subsystem model is established based on the relative speed, the relative vehicle distance error, and the acceleration of the vehicle i.

The vehicle queue includes n vehicles, including vehicle 0, vehicle 1, vehicle n−1, the vehicle numbered 0 is a leading vehicle, the vehicle 1, . . . , vehicle n−1 are following vehicles. A vehicle and its adjacent front vehicle form a vehicle-following subsystem, for example, for a vehicle-following subsystem formed by the vehicle i and the vehicle i−1, since the vehicle i−1 is arranged in front of the vehicle i, the vehicle i is called as a self-vehicle, and the vehicle i−1 is called as a front-vehicle. Each vehicle in the vehicle queue is provided with a radar and a communication device, and the vehicles in the vehicle queue may communicate. The vehicle i may obtain its speed and its acceleration, the speed and the acceleration of the vehicle i−1, and the vehicle distance between the vehicle i and the vehicle i−1.

The vehicle-following subsystem model may be established with the relative speed $\Delta v_i$ and the relative vehicle distance error $\Delta R_i$ as state variables, and the state equation of the vehicle-following subsystem model comprises:

$$\begin{cases} \Delta \dot{v}_i = a_{i-1} - a_i \\ \Delta \dot{R}_i = \Delta v_i - \dot{R}_{ides} \end{cases}, \quad (4)$$

$$a_i \in \{a_{ipls}, a_{igld}\}, a_{i-1} \in \{a_{(i-1)pls}, a_{(i-1)gld}\}, i = 1, \ldots, n-1$$

where $a_i$ denotes the acceleration of vehicle i, $a_{i-1}$ denotes the acceleration of vehicle i−1, $\Delta \dot{v}_i$ denotes derivative of $\Delta v_i$ to time, $\Delta \dot{R}_i$ denotes derivative of $\Delta R_i$ to time, $\dot{R}_{ides}$ denotes derivative of $R_{ides}$ to time, $a_{ipls}$ denotes of the acceleration of vehicle i in the pulse phase, $a_{igld}$ denotes of the acceleration of vehicle i in the glide phase, $a_{(i-1)pls}$ denotes of the acceleration of vehicle i−1 in the pulse phase, $a_{(i-1)gld}$ denotes of the acceleration of vehicle i−1 in the glide phase.

At block 104, a state trajectory of the vehicle-following subsystem model is determined on a $\Delta v$-$\Delta R$ plane, the $\Delta v$-$\Delta R$ plane denotes a rectangular coordinate plane with the relative speed $\Delta v_i$ as a horizontal axis and the relative vehicle distance error $\Delta R_i$ as a vertical axis.

For the vehicle-following subsystem model formed by the vehicle i and the vehicle i−1, since each of the vehicle i and the vehicle i−1 may have two travelling modes, including a pulse mode (P for short) and a glide mode (G for short), the vehicle-following subsystem model may have four modes, including a P-P mode (vehicle i pulses, vehicle i−1 pulses), a P-G mode (vehicle i pulses, vehicle i−1 glides), a G-P mode (vehicle i glides, vehicle i−1 pulses), and a G-G mode (vehicle i glides, vehicle i−1 glides).

Based on the above formula (3) and (4), the state trajectory of the self-vehicle on the $\Delta v$-$\Delta R$ plane may be determined, when the relative acceleration $a_{rel}$ between the self-vehicle and the front-vehicle is 0, i.e., $a_{rel}=0$, the state trajectory of the self-vehicle on the $\Delta v$-$\Delta R$ plane may be a vertical line. When $a_{rel} \neq 0$, the state trajectory of the self-vehicle on the $\Delta v$-$\Delta R$ plane may be a quadratic curve (a parabola), which may be expressed by:

$$\Delta R = \frac{(\Delta v - \tau_h a_F)^2}{2a_{rel}} - \frac{(\Delta v_0 - \tau_h a_F)^2}{2a_{rel}} + \Delta R_0, \quad (5)$$

when $a_{rel} \neq 0$ where $a_{rel}=a_p-a_F$ represents the relative acceleration between the self-vehicle and the front-vehicle, $a_p$ represents the acceleration of the front-vehicle, $a_F$ represents the acceleration of the self-vehicle, $\Delta v_0$ represents an initial value of the relative speed between the front-vehicle and the self-vehicle at initial time, $\Delta R_0$ represents an initial value of the relative distance between the front-vehicle and the self-vehicle at initial time, $$\frac{(\Delta v_0 - \tau_h a_F)^2}{2a_{rel}}$$

and $\Delta R_0$ are constants.

At block 105, a plurality of division graphs is determined according to the state trajectory, and the plurality of division graphs are combined to obtain a switching control graph.

Figure 2A:
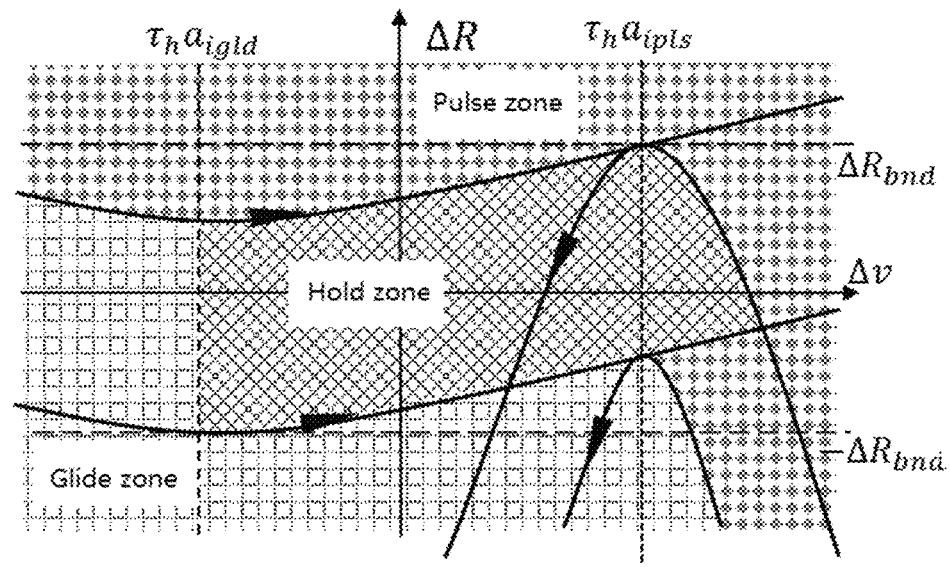
FIG. 2*a*-FIG. 2*c* are schematic diagrams of a division graph according to some embodiments of the present disclosure.

When the front-vehicle is in the pulse phase, the vehicle-following subsystem may be in the P-P mode or the P-G mode. When the vehicle-following subsystem is in the P-P mode and the relative acceleration between the self-vehicle and the front-vehicle is less than 0, i.e., $a_{rel\_PP}<0$, the division graphs of the vehicle-following subsystem may be shown in FIG. 2a. As shown in FIG. 2a, in the glide zone, the self-vehicle glides, and the acceleration is $a_{igld}$, in the pulse zone, the self-vehicle pulses, and the acceleration is $a_{ipls}$, in the hold zone, the travelling mode of the self-vehicle keeps the travelling mode at a previous moment, i.e., when the self-vehicle pulses at the previous moment, the self-vehicle may pulse, and when the self-vehicle glides at the previous moment, the self-vehicle may also glide.

Figure 2B:
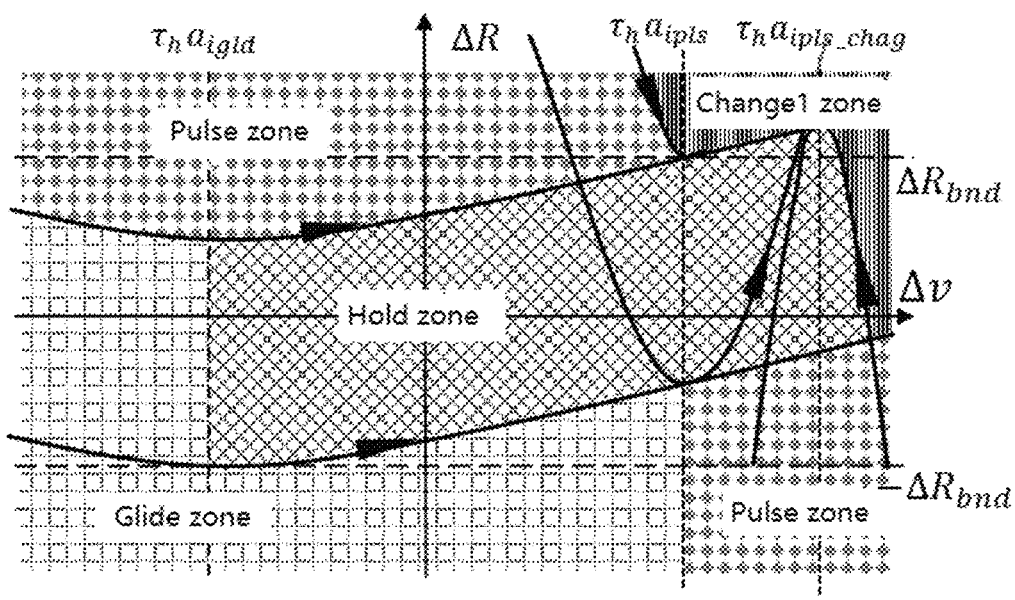
Figure 2C:
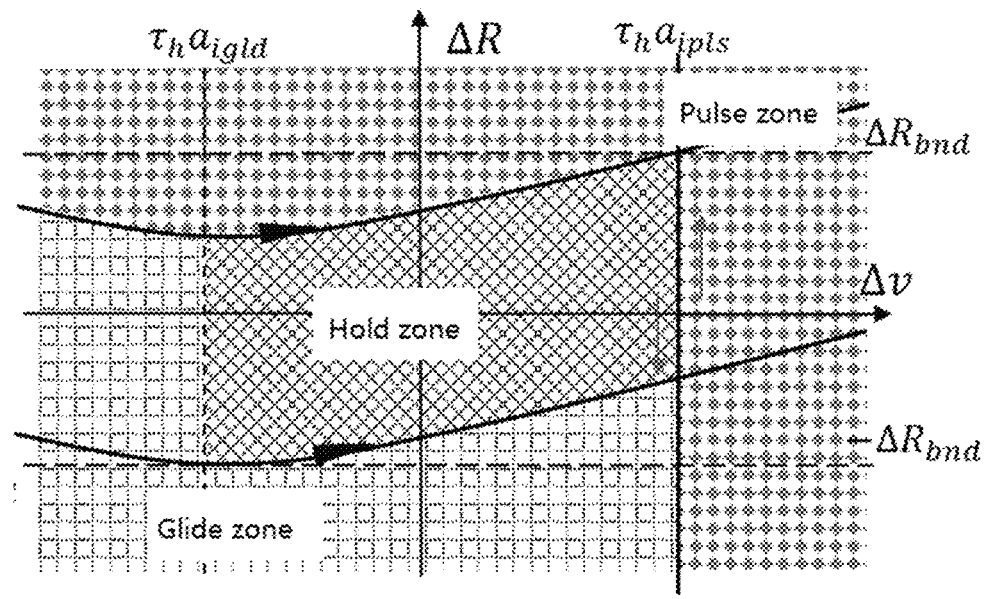

When $a_{rel\_PP}>0$, the division graphs of the vehicle-following subsystem may be shown in FIG. 2b. As shown in FIG. 2b, in the change 1 zone, the self-vehicle may change its acceleration, i.e., $a_{ipls\_Chag}=a_{(i-1)pls}+k$, where k is a constant greater than zero. When $a_{rel\_PP}=0$, the division graphs of the vehicle-following subsystem may be shown in FIG. 2c.

Figure 3A:
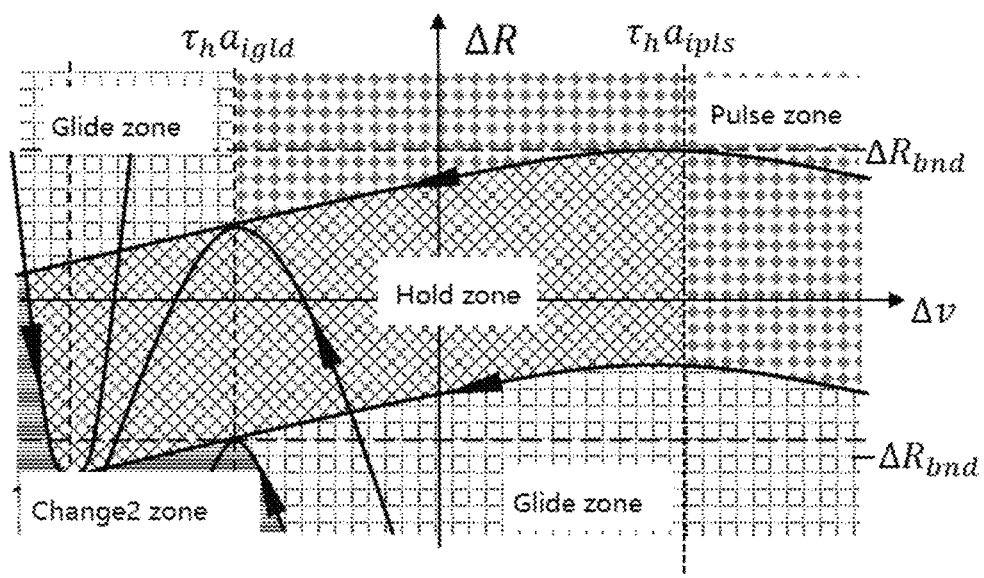
FIG. 3*a*-FIG. 3*c* are schematic diagrams of a division graph according to some embodiments of the present disclosure.
Figure 3B:
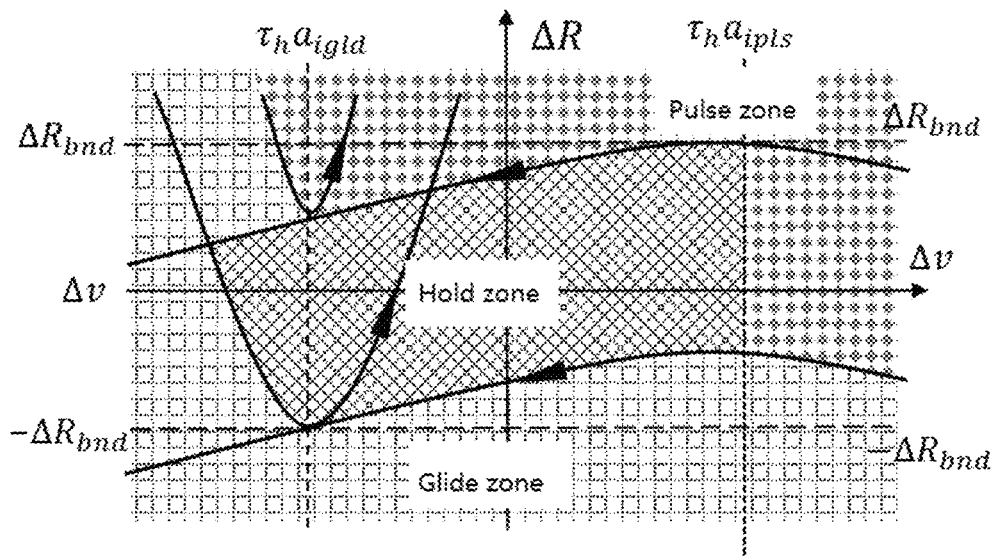
Figure 3C:
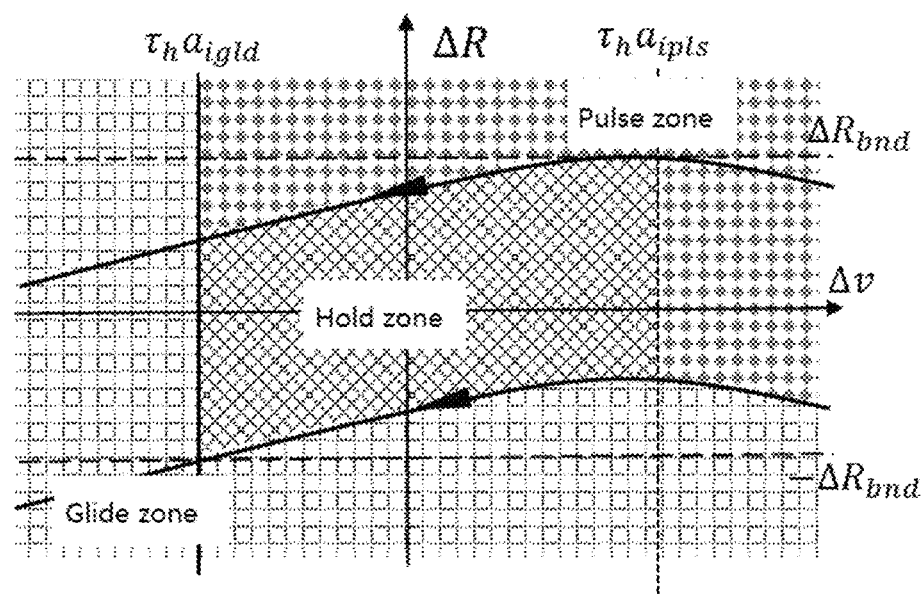

When the front-vehicle is in the glide phase, the vehicle-following subsystem may be in the G-P mode or the G-G mode. Similar to cases when the front-vehicle pulses, there may also be three cases, including $a_{rel\_GG}<0$, $a_{rel\_GG}>0$ and $a_{rel\_GG}=0$. When $a_{rel\_GG}<0$ the division graphs of the vehicle-following subsystem may be shown in FIG. 3a, when $a_{rel\_GG}>0$ the division graphs of the vehicle-following subsystem may be shown in FIG. 3b, and when $a_{rel\_GG}=0$ the division graphs of the vehicle-following subsystem may be shown in FIG. 3c. In the change 2 zone, the self-vehicle may decelerate, and $a_{igld\_Chag}=a_{(i-1)gld}-k$.

Figure 4A:
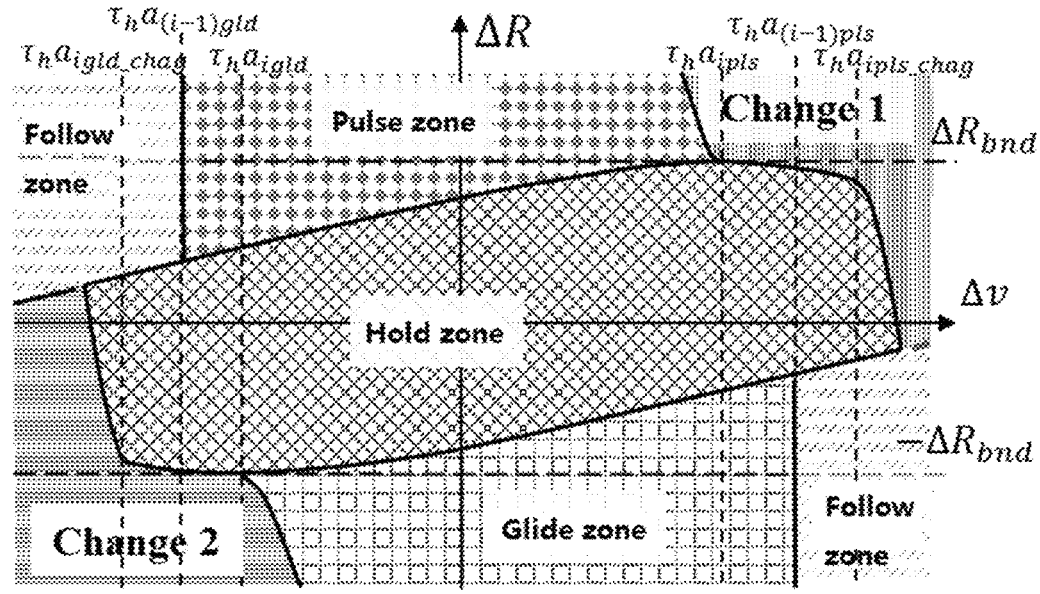
FIG. 4*a*-FIG. 4*c* are schematic diagrams of a switching control graph according to some embodiments of the present disclosure.
Figure 4B:
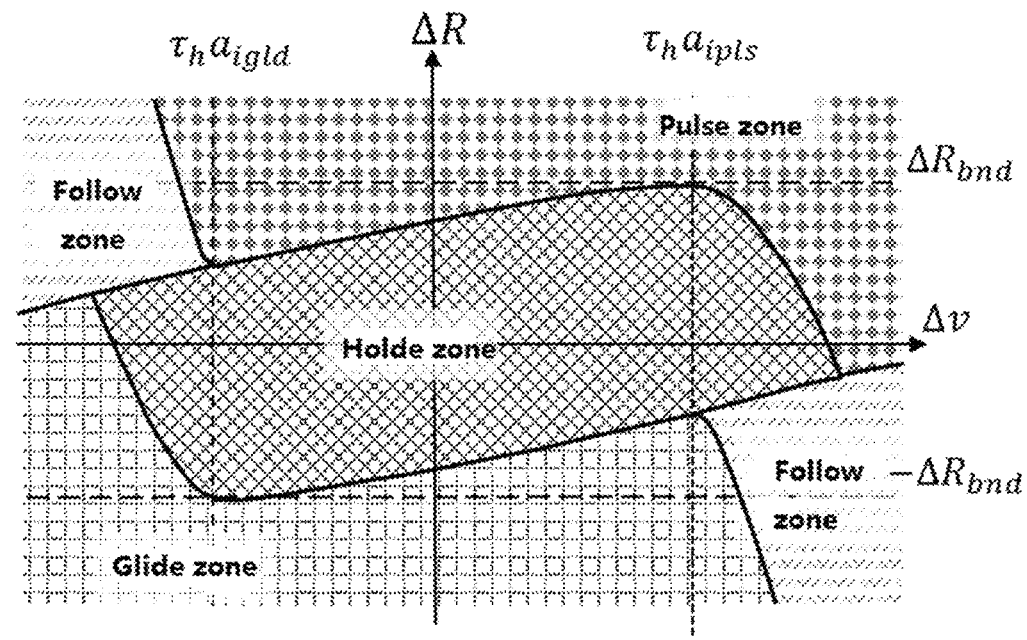
Figure 4C:
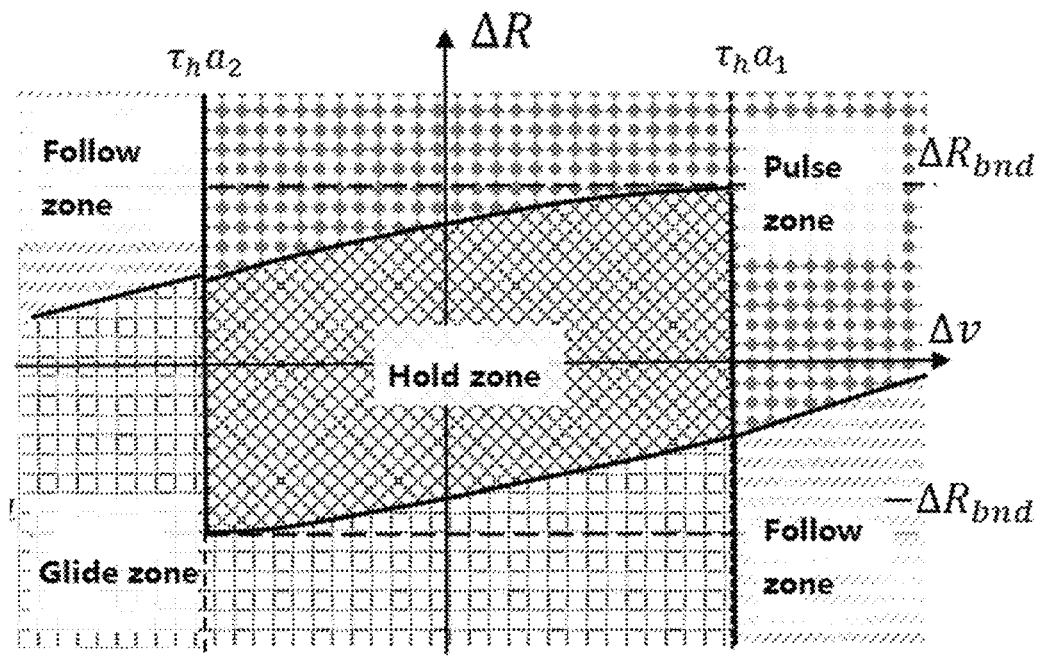

In an embodiment, the division graph of the self-vehicle in the pulse phase and the glide phase may be combined to obtain the switching control graph of the self-vehicle. When $a_{rel\_PP}<0$ and $a_{rel\_GG}>0$, the switching control graph may be shown in FIG. 4a, when $a_{rel\_pp}>0$ and $a_{rel\_GG}<0$, the switching control graph may be shown in FIG. 4b, when $a_{rel\_pp}>0$ and $a_{rel\_GG}<0$, the switching control graph may be shown in FIG. 4c. The glide zone may denote that the self-vehicle glides when the front-vehicle pulses or glides. The pulse zone may denote that the self-vehicle pulses when the front-vehicle pulses or glides. The change 1 zone may denote that the self-vehicle pulses with a changed acceleration when the front-vehicle pulses or glides. The Change 2 zone may denote that the self-vehicle glides with the changed acceleration when the front-vehicle pulses or glides. The hold zone may denote that the acceleration of the self-vehicle keeps acceleration at a previous moment when the front-vehicle pulses or glides. The follow zone may denote the self-vehicle pulses when the front-vehicle pulses, and the self-vehicle glides when the front-vehicle glides.

At block 106, an acceleration control value is obtained according to the switching control map.

The acceleration control value of the vehicle i in each zone may be obtained by:

$$u(t) = \begin{cases} a_{ipls}, (\Delta v, \Delta R) \in \text{pulse zone} \\ a_{igld}, (\Delta v, \Delta R) \in \text{glide zone} \\ \begin{cases} a_{ipls}, \text{ if } a_{i-1} = a_{(i-1)pls} \\ a_{igld}, \text{ if } a_{i-1} = a_{(i-1)gld} \end{cases}, (\Delta v, \Delta R) \in \text{follow zone} \\ \lim_{t^* \to t^-} u(t^*), (\Delta v, \Delta R) \in \text{hold zone} \\ a_{(i-1)pls} + k, (\Delta v, \Delta R) \in \text{change 1 zone} \\ a_{(i-1)gld} - k, (\Delta v, \Delta R) \in \text{change 2 zone} \end{cases} \quad (6)$$

where k is a constant.

With the method according to embodiments of the present disclosure, travelling information (speed and acceleration) of the front-vehicle is obtained, the relative vehicle speed and the relative vehicle distance between the self-vehicle and the front-vehicle are obtained, and the operating point of vehicle is calculated according to information of the self-vehicle. The vehicle-following subsystem model formed by two adjacent vehicles is established, the state trajectory of the model is analyzed, and the control value of the vehicle in each phase is obtained, such that the vehicle is always at the economic acceleration and idle operating acceleration, the engine of the vehicle can be in the economic operating zone, thereby ensuring stability of the vehicle queue, and reducing the fuel consumption of the vehicle queue.

Figure 5:
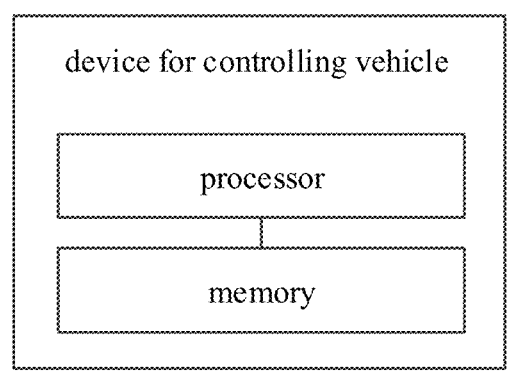
FIG. 5 is block diagram of a device for controlling a vehicle according to some embodiments of the present disclosure.

Embodiments of the present disclosure further provide a device for controlling a vehicle. FIG. 5 is block diagram of a device for controlling a vehicle according to some embodiments of the present disclosure. As illustrated in FIG. 5, the device includes a processor, and a memory. The processor is configured to run a program corresponding to executable program codes by reading the executable program codes stored in the memory, to perform the method for controlling a vehicle according to embodiments of the present disclosure.

Embodiment of the present disclosure further provides a non-transitory computer storage medium, having stored therein a computer program that, when executed by a processor, causes the method for controlling a vehicle according to embodiments of the present disclosure to be implemented.

It should be noted that in the embodiments of the present disclosure, terms such as "first" and "second" are used only for a description purpose, and shall not be construed as indicating or implying relative importance. In addition, in the descriptions of the present disclosure, unless otherwise stated, "multiple" means two or more than two.

Any process or method in the flowcharts or described herein in another manner may be understood as indicating a module, a segment, or a part including code of one or more executable instructions for implementing a particular logical function or process step. In addition, the scope of preferred embodiments of the present disclosure include other implementations which do not follow the order shown or discussed, including performing, according to involved functions, the functions basically simultaneously or in a reverse order, which should be understood by technical personnel in the technical field to which the embodiments of the present disclosure belong.

It should be understood that the parts of the present disclosure may be implemented by hardware, software, firmware, or a combination thereof. In the implementation manners, multiple steps or methods may be implemented by using software or firmware that is stored in a memory and that is executed by an appropriate instruction execution system. For example, if hardware is used for implementation, as in another implementation manner, any one of or a combination of the following technologies known in the art may be used for implementation: a discrete logic circuit having a logic gate circuit configured to implement a logical function for a data signal, an application-specific integrated circuit having an appropriate combinational logic gate circuit, a programmable gate array (PGA), a field programmable gate array (FPGA), and the like.

A person of ordinary skill in the art may understand that all or part of the steps of the method of the embodiments may be implemented by a program instructing relevant hardware. The program may be stored in a computer readable storage medium. When the program is executed, one or a combination of the steps of the method embodiments is performed.

In addition, functional units in the embodiments of the present disclosure may be integrated into one processing module, or each of the units may exist alone physically, or two or more units may be integrated into one module. The integrated module may be implemented in a form of hardware or a software functional module. If implemented in a form of a software functional module and sold or used as an independent product, the integrated module may also be stored in a computer readable storage medium.

The aforementioned storage medium may be a read-only memory, a magnetic disk, or an optical disc.

In the descriptions of this specification, a description of a reference term such as "an embodiment", "some embodiments", "an example", "a specific example", or "some examples" means that a specific feature, structure, material, or characteristic that is described with reference to the embodiment or the example is included in at least one embodiment or example of the present disclosure. In this specification, exemplary descriptions of the foregoing terms do not necessarily refer to a same embodiment or example. In addition, the described specific feature, structure, material, or characteristic may be combined in an appropriate manner in any one or more embodiments or examples.

Although the embodiments of the present disclosure have been shown and described above, it may be understood that the embodiments are exemplary and cannot be construed as a limitation to the present disclosure, and a person of ordinary skill in the art can make changes, modifications, replacements, and variations to the embodiments without departing from the scope of the present disclosure.

What is claimed is:

1. A method for controlling a vehicle, wherein the vehicle is in a vehicle queue, the vehicle queue comprises n vehicles {vehicle 0, vehicle 1, . . . , vehicle n−1} arranged in order along a traveling direction, the method is performed by a computing device of the vehicle i, i is from 1 to n−1, the method comprises:
   obtaining acceleration of the vehicle i in each of a plurality of traveling phases;
   obtaining a relative speed $\Delta v_i$ of the vehicle i and a vehicle i−1, wherein the vehicle i−1 is a vehicle arranged in front of the vehicle i according to the traveling direction of the vehicle queue;
   obtaining a vehicle distance $R_i$ between the vehicle i and the vehicle i−1, and obtaining a relative vehicle distance error $\Delta R_i$ between the vehicle i and the vehicle i−1 based on the vehicle distance $R_i$ and a preset desired vehicle distance $R_{ides}$;

establishing a vehicle-following subsystem model based on the relative speed $\Delta v_i$, the relative vehicle distance error $\Delta R_i$ and the acceleration of the vehicle i, and determining a state trajectory of the vehicle-following subsystem model on a $\Delta v$-$\Delta R$ plane, wherein the $\Delta v$-$\Delta R$ plane denotes a rectangular coordinate plane with the relative speed $\Delta v_i$ as a horizontal axis and the relative vehicle distance error $\Delta R_i$ as a vertical axis;

determining, according to the state trajectory, a plurality of division graphs of the vehicle i−1 in a plurality of travelling phases, and combining the plurality of division graphs to obtain a switching control graph for the vehicle i; and obtaining an acceleration control value of the vehicle i according to the switching control map.

2. The method according to claim 1, wherein obtaining the relative speed $\Delta v_i$ of the vehicle i and the vehicle i−1 comprises:

obtaining a speed of the vehicle i;

obtaining a speed of the vehicle i−1 by a communication device of the vehicle i;

calculating the relative speed $\Delta v_i$ between the vehicle i and the vehicle i−1 based on the speed of the vehicle i and the speed of the vehicle i−1.

3. The method according to claim 1, wherein the preset desired vehicle distance $R_{ides}$ is obtained by:

$$R_{ides} \tau_h \cdot v_i + d_0;$$

where $\tau_h$ denotes a preset time interval, $v_i$ denotes the speed of the vehicle i, do denotes a preset desired vehicle distance;

obtaining the relative vehicle distance error $\Delta R_i$ between the vehicle i and the vehicle i−1 based on the vehicle distance R and the preset desired vehicle distance $R_{ides}$ comprises:

performing a difference operation on the vehicle distance $R_i$ and the preset desired vehicle distance $R_{ides}$, to obtain the relative vehicle distance error $\Delta R_i$, wherein the relative vehicle distance error $\Delta R_i$ is within a preset error bound.

4. The method according to claim 1, wherein the plurality of travelling phases of the vehicle i comprises a pulse phase and a glide phase, the plurality of travelling phases of the vehicle i−1 comprises a pulse phase and a glide phase, the acceleration of the vehicle in the pulse phase is obtained by a formula:

$$a_{pls} = \left(\frac{\eta_T P_{e-P}}{v} - C_A v^2 - Mfg\right) \cdot \frac{1}{\delta M}$$

the acceleration of the vehicle in the glide phase is obtained by a formula:

$$a_{gld} = (-C_A v^2 - Mfg) \cdot \frac{1}{\delta M}$$

where $\eta_T$ denotes a total drive efficiency of a drive train, $C_A=0.5 C_D \rho_a A_v$, $C_D$ denotes a drag coefficient, $\rho_a$ denotes an air density, $A_v$ denotes a windward area of the vehicle, M denotes a mass of the vehicle, g denotes a gravity coefficient, f denotes a friction coefficient, $\delta$ denotes a correction coefficient of rotating mass, $P_{e-P}$ denotes a power at which an engine of the vehicle is operating at the minimum fuel consumption point, $a_{pls}$ denotes the acceleration of the vehicle in the pulse phase, and $a_{gld}$ denotes the acceleration of the of the vehicle in the glide phase.

5. The method according to claim 1, wherein a state equation of the vehicle-following subsystem model comprises:

$$\begin{cases} \Delta \dot{v}_i = a_{i-1} - a_i \\ \Delta \dot{R}_i = \Delta v_i - \dot{R}_{ides} \end{cases},$$

$$a_i \in \{a_{ipls}, a_{igld}\}, a_{i-1} \in \{a_{(i-1)pls}, a_{(i-1)gld}\}, i = 1, \ldots, n-1$$

where $a_i$ denotes the acceleration of vehicle i, $a_{i-1}$ denotes the acceleration of vehicle i−1, $\Delta \dot{v}_i$ denotes derivative of $\Delta v_i$ to time, $\Delta \dot{R}_i$ denotes derivative of $\Delta R_i$ to time, $\dot{R}_{ides}$ denotes derivative of $R_{ides}$ to time, $a_{ipls}$ denotes of the acceleration of vehicle i in the pulse phase, $a_{igld}$ denotes of the acceleration of vehicle i in the glide phase, $a_{(i-1)pls}$ denotes of the acceleration of vehicle i−1 in the pulse phase, $a_{(i-1)gld}$ denotes of the acceleration of vehicle i−1 in the glide phase.

6. The method according to claim 4, wherein the switching control graph comprises a glide zone, a pulse zone, a change 1 zone, a change 2 zone, a hold zone, and a follow zone.

7. The method according to claim 6, wherein the acceleration control value of the vehicle i in each zone is obtained by:

$$u(t) = \begin{cases} a_{ipls}, (\Delta v, \Delta R) \in \text{pulse zone} \\ a_{igld}, (\Delta v, \Delta R) \in \text{glide zone} \\ \begin{cases} a_{ipls}, \text{if } a_{i-1} = a_{(i-1)pls} \\ a_{igld}, \text{if } a_{i-1} = a_{(i-1)gld} \end{cases}, (\Delta v, \Delta R) \in \text{follow zone} \\ \lim_{t^* \to t^-} u(t^*), (\Delta v, \Delta R) \in \text{hold zone} \\ a_{(i-1)pls} + k, (\Delta v, \Delta R) \in \text{change 1 zone} \\ a_{(i-1)gld} - k, (\Delta v, \Delta R) \in \text{change 2 zone} \end{cases}$$

where k is a constant.

8. A device for controlling a vehicle, wherein the vehicle is in a vehicle queue, the vehicle queue comprises n vehicles {vehicle 0, vehicle 1, . . . , vehicle n−1} arranged in order along a traveling direction, the device comprises:

a processor;

a memory; and wherein the processor is configured to run a program corresponding to executable program codes by reading the executable program codes stored in the memory, to:

obtain acceleration of the vehicle i in each of a plurality of travelling phases, where i is from 1 to n−1;

obtain a relative speed $\Delta v_i$ of the vehicle i and a vehicle i−1, wherein the vehicle i−1 is a vehicle arranged in front of the vehicle i according to the traveling direction of the vehicle queue;

obtain a vehicle distance $R_i$ between the vehicle i and the vehicle i−1, and obtain a relative vehicle distance error $\Delta R_i$, between the vehicle i and the vehicle i−1 based on the vehicle distance $R_i$ and a preset desired vehicle distance $R_{ides}$;

establish a vehicle-following subsystem model based on the relative speed $\Delta v_i$, the relative vehicle distance error $\Delta R_i$, and the acceleration of the vehicle i, and determine a state trajectory of the vehicle-following subsystem model on a Δv-ΔR plane, wherein the Δv-ΔR plane denotes a rectangular coordinate plane with the relative speed $\Delta v_i$ as a horizontal axis and the relative vehicle distance error $\Delta R_i$ as a vertical axis;

determine, according to the state trajectory, a plurality of division graphs of the vehicle i−1 in a plurality of travelling phases, and combine the plurality of division graphs to obtain a switching control graph for the vehicle i; and obtain an acceleration control value of the vehicle i according to the switching control map.

9. The device according to claim 8, wherein the processor is further configured to:

obtain a speed of the vehicle i;

obtain a speed of the vehicle i−1 by a communication device of the vehicle i;

calculate the relative speed $\Delta v_i$ between the vehicle i and the vehicle i−1 based on the speed of the vehicle i and the speed of the vehicle i−1.

10. The device according to claim 8, wherein the preset desired vehicle distance $R_{ides}$ is obtained by:

$$R_{ides} = \tau_h \cdot v_i + d_0;$$

where $\tau_h$ denotes a preset time interval, $v_i$ denotes the speed of the vehicle i, $d_0$ denotes a preset desired vehicle distance;

the processor is configured to obtain the relative vehicle distance error $\Delta R_i$ between the vehicle i and the vehicle i−1 based on the vehicle distance $R_i$ and the preset desired vehicle distance $R_{ides}$ by acts of:

performing a difference operation on the vehicle distance $R_i$ and the preset desired vehicle distance $R_{ides}$, to obtain the relative vehicle distance error $\Delta R_i$, wherein the relative vehicle distance error $\Delta R_i$ is within a preset error bound.

11. The device according to claim 8, wherein the plurality of travelling phases of the vehicle i comprises a pulse phase and a glide phase, the plurality of travelling phases of the vehicle i−1 comprises a pulse phase and a glide phase, the acceleration of the vehicle in the pulse phase is obtained by a formula:

$$a_{pls} = \left(\frac{\eta_T P_{e-P}}{v} - C_A v^2 - Mfg\right) \cdot \frac{1}{\delta M}$$

the acceleration of the vehicle in the glide phase is obtained by a formula:

$$a_{gld} = (-C_A v^2 - Mfg) \cdot \frac{1}{\delta M}$$

where $\eta_T$ denotes a total drive efficiency of a drive train, $C_A = 0.5 C_D \rho_a A_v$, $C_D$ denotes a drag coefficient, $\rho_a$ denotes an air density, $A_v$ denotes a windward area of the vehicle, M denotes a mass of the vehicle, g denotes a gravity coefficient, f denotes a friction coefficient, δ denotes a correction coefficient of rotating mass, $P_{e-P}$ denotes a power at which an engine of the vehicle is operating at the minimum fuel consumption point, $a_{pls}$ denotes the acceleration of the vehicle in the pulse phase, and $a_{gld}$ denotes the acceleration of the of the vehicle in the glide phase.

12. The device according to claim 8, wherein a state equation of the vehicle-following subsystem model comprises:

$$\begin{cases} \Delta \dot{v}_i = a_{i-1} - a_i \\ \Delta \dot{R}_i = \Delta v_i - \dot{R}_{ides} \end{cases},$$

$$a_i \in \{a_{ipls}, a_{igld}\}, a_{i-1} \in \{a_{(i-1)pls}, a_{(i-1)gld}\}, i = 1, \ldots, n-1$$

where $a_i$ denotes the acceleration of vehicle i, $a_{i-1}$ denotes the acceleration of vehicle i−1, $\Delta \dot{v}_i$ denotes derivative of $\Delta v_i$ to time, $\Delta \dot{R}_i$ denotes derivative of $\Delta R_i$ to time, $\dot{R}_{ides}$ denotes derivative of $R_{ides}$ to time, $a_{ipls}$ denotes of the acceleration of vehicle i in the pulse phase, $a_{igld}$ denotes of the acceleration of vehicle i in the glide phase, $a_{(i-1)pls}$ denotes of the acceleration of vehicle i−1 in the pulse phase, $a_{(i-1)gld}$ denotes of the acceleration of vehicle i−1 in the glide phase.

13. The device according to claim 11, wherein the switching control graph comprises a glide zone, a pulse zone, a change 1 zone, a change 2 zone, a hold zone, and a follow zone.

14. The device according to claim 13, wherein the acceleration control value of the vehicle i in each zone is obtained by:

$$u(t) = \begin{cases} a_{ipls}, (\Delta v, \Delta R) \in \text{pulse zone} \\ a_{igld}, (\Delta v, \Delta R) \in \text{glide zone} \\ \begin{cases} a_{ipls}, \text{if } a_{i-1} = a_{(i-1)pls} \\ a_{igld}, \text{if } a_{i-1} = a_{(i-1)gld} \end{cases}, (\Delta v, \Delta R) \in \text{follow zone} \\ \lim_{t^* \to t^-} u(t^*), (\Delta v, \Delta R) \in \text{hold zone} \\ a_{(i-1)pls} + k, (\Delta v, \Delta R) \in \text{change 1 zone} \\ a_{(i-1)gld} - k, (\Delta v, \Delta R) \in \text{change 2 zone} \end{cases}$$

where k is a constant.

15. A non-transitory computer readable storage medium having stored thereon a computer program that, when executed by a processor, causes a method for controlling a vehicle to be implemented, wherein the vehicle is in a vehicle queue, the vehicle queue comprises n vehicles {vehicle 0, vehicle 1, . . . , vehicle n−1} arranged in order along a traveling direction, the method is performed by a computing device of the vehicle i, i is from 1 to n−1, the method comprises:

obtaining acceleration of the vehicle i in each of a plurality of travelling phases;

obtaining a relative speed $\Delta v_i$ between the vehicle i and a vehicle i−1, wherein the vehicle i−1 is a vehicle arranged in front of the vehicle i according to the traveling direction of the vehicle queue;

obtaining a vehicle distance R between the vehicle i and the vehicle i−1, and obtaining a relative vehicle distance error $\Delta R_i$ between the vehicle i and the vehicle i−1 based on the vehicle distance $R_i$ and a preset desired vehicle distance $R_{ides}$;

establishing a vehicle-following subsystem model based on the relative speed $\Delta v_i$, the relative vehicle distance error $\Delta R_i$, and the acceleration of the vehicle i, and determining a state trajectory of the vehicle-following subsystem model on a Δv-ΔR plane, wherein the Δv-ΔR plane denotes a rectangular coordinate plane with the relative speed $\Delta v_i$ as a horizontal axis and the relative vehicle distance error $\Delta R_i$ as a vertical axis;

determining, according to the state trajectory, a plurality of division graphs of the vehicle i−1 in a plurality of travelling phases, and combining the plurality of division graphs to obtain a switching control graph for the vehicle i; and obtaining an acceleration control value of the vehicle i according to the switching control map.

16. The non-transitory computer readable storage medium according to claim 15, wherein the preset desired vehicle distance $R_{ides}$ is obtained by:

$$R_{ides} = \tau_h \cdot v_i + d_0;$$

where $\tau_h$ denotes a preset time interval, $v_i$ denotes the speed of the vehicle i, $d_0$ denotes a preset desired vehicle distance;

obtaining the relative vehicle distance error $\Delta R_i$ between the vehicle i and the vehicle i−1 based on the vehicle distance $R_i$ and the preset desired vehicle distance $R_{ides}$ comprises:

performing a difference operation on the vehicle distance $R_i$ and the preset desired vehicle distance $R_{ides}$, to obtain the relative vehicle distance error $\Delta R_i$, wherein the relative vehicle distance error $\Delta R_i$ is within a preset error bound.

17. The non-transitory computer readable storage medium according to claim 15, wherein the plurality of travelling phases of the vehicle i comprises a pulse phase and a glide phase, the plurality of travelling phases of the vehicle i−1 comprises a pulse phase and a glide phase, the acceleration of the vehicle in the pulse phase is obtained by a formula:

$$a_{pls} = \left(\frac{\eta_T P_{e-P}}{v} - C_A v^2 - Mfg\right) \cdot \frac{1}{\delta M}$$

the acceleration of the vehicle in the glide phase is obtained by a formula:

$$a_{gld} = (-C_A v^2 - Mfg) \cdot \frac{1}{\delta M}$$

where $\eta_T$ denotes a total drive efficiency of a drive train, $C_A = 0.5 C_D \rho_a A_v$, $C_D$ denotes a drag coefficient, $\rho_a$ denotes an air density, $A_v$ denotes a windward area of the vehicle, M denotes a mass of the vehicle, g denotes a gravity coefficient, f denotes a friction coefficient, $\delta$ denotes a correction coefficient of rotating mass, $P_{e-p}$ denotes a power at which an engine of the vehicle is operating at the minimum fuel consumption point, $a_{pls}$ denotes the acceleration of the vehicle in the pulse phase, and $a_{gld}$ denotes the acceleration of the of the vehicle in the glide phase.

18. The non-transitory computer readable storage medium according to claim 15, wherein a state equation of the vehicle-following subsystem model comprises:

$$\begin{cases} \Delta \dot{v}_i = a_{i-1} - a_i \\ \Delta \dot{R}_i = \Delta v_i - \dot{R}_{ides} \end{cases},$$

$$a_i \in \{a_{ipls}, a_{igld}\}, a_{i-1} \in \{a_{(i-1)pls}, a_{(i-1)gld}\}, i = 1, \ldots, n-1$$

where $a_i$ denotes the acceleration of vehicle i, $a_{i-1}$ denotes the acceleration of vehicle i−1, $\Delta \dot{v}_i$ denotes derivative of $\Delta v_i$ to time, $\Delta \dot{R}_i$ denotes derivative of $\Delta R_i$ to time, $\dot{R}_{ides}$ denotes derivative of $R_{ides}$ to time, $a_{ipls}$ denotes of the acceleration of vehicle i in the pulse phase, $a_{igld}$ denotes of the acceleration of vehicle i in the glide phase, $a_{(i-1)pls}$ denotes of the acceleration of vehicle i−1 in the pulse phase, $a_{(i-1)gld}$ denotes of the acceleration of vehicle i−1 in the glide phase.

19. The non-transitory computer readable storage medium according to claim 15, wherein the switching control graph comprises a glide zone, a pulse zone, a change 1 zone, a change 2 zone, a hold zone, and a follow zone.

20. The non-transitory computer readable storage medium according to claim 19, wherein the acceleration control value of the vehicle i in each zone is obtained by:

$$u(t) = \begin{cases} a_{ipls}, (\Delta v, \Delta R) \in \text{pulse zone} \\ a_{igld}, (\Delta v, \Delta R) \in \text{glide zone} \\ \begin{cases} a_{ipls}, \text{if } a_{i-1} = a_{(i-1)pls} \\ a_{igld}, \text{if } a_{i-1} = a_{(i-1)gld} \end{cases}, (\Delta v, \Delta R) \in \text{follow zone} \\ \lim_{t^* \to t^-} u(t^*), (\Delta v, \Delta R) \in \text{hold zone} \\ a_{(i-1)pls} + k, (\Delta v, \Delta R) \in \text{change 1 zone} \\ a_{(i-1)gld} - k, (\Delta v, \Delta R) \in \text{change 2 zone} \end{cases}$$

where k is a constant.

* * * * *